(12) United States Patent
Yang et al.

(10) Patent No.: US 9,703,189 B2
(45) Date of Patent: Jul. 11, 2017

(54) METHOD OF CALCULATING A SHIFT VALE OF A CELL CONTACT

(71) Applicant: SAMSUNG ELECTRONICS CO., LTD., Suwon-si, Gyeonggi-do (KR)

(72) Inventors: Ki-Ho Yang, Hwaseong-si (KR); Sibo Cai, Hwaseong-si (KR); Seung-Hune Yang, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 186 days.

(21) Appl. No.: 14/685,620

(22) Filed: Apr. 14, 2015

(65) Prior Publication Data

US 2016/0070163 A1 Mar. 10, 2016

(30) Foreign Application Priority Data

Sep. 5, 2014 (KR) .................. 10-2014-0118933

(51) Int. Cl.
*G06F 17/50* (2006.01)
*G03F 1/72* (2012.01)
*G03F 1/84* (2012.01)

(52) U.S. Cl.
CPC . *G03F 1/72* (2013.01); *G03F 1/84* (2013.01)

(58) Field of Classification Search
USPC .......................................................... 716/51
See application file for complete search history.

(56) References Cited

U.S. PATENT DOCUMENTS

| 6,861,181 | B1 | 3/2005 | Henderson |
| 7,240,307 | B2 | 7/2007 | Aoyama et al. |
| 7,346,882 | B2 | 3/2008 | Abe |
| 7,827,520 | B2 | 11/2010 | Choi |
| 2013/0234020 | A1 | 9/2013 | Ogino et al. |
| 2014/0101624 | A1 | 4/2014 | Wu et al. |
| 2014/0377888 | A1* | 12/2014 | Fan .................. H01L 22/30 438/14 |

FOREIGN PATENT DOCUMENTS

| JP | 1994-129814 A | 5/1994 |
| KR | 2001-0019334 A | 3/2001 |
| KR | 2003-0070442 A | 8/2003 |
| KR | 0680936 B | 2/2007 |
| KR | 0702794 B1 | 3/2007 |
| KR | 2008-0102648 A | 11/2008 |
| KR | 0914297 B | 8/2009 |
| KR | 2010-0127671 A | 12/2010 |

* cited by examiner

*Primary Examiner* — Bryce Aisaka
(74) *Attorney, Agent, or Firm* — Volentine & Whitt, PLLC

(57) ABSTRACT

In a method of calculating a shift value of a cell contact, a reference region and a correction region may be set on an image of an actual cell block. The cell block may include a plurality of actual cell contacts formed using a mask. Each of preliminary shift values of the actual cell contacts with respect to target cell contacts in a target cell block to be formed using the mask may be measured based on the image. The preliminary shift values of the actual cell contacts in the reference region may be minimized. Actual shift values of the actual cell contacts in the correction region with respect to the minimized preliminary shift values may be calculated. Thus, the mask may be corrected using the accurately measured shift values so that the cell contacts may have designed positions.

5 Claims, 11 Drawing Sheets

METHOD OF CALCULATING A SHIFT VALE OF A CELL CONTACT

PRIORITY STATEMENT

This application claims priority under 35 USC §119 to Korean Patent Application No. 2014-118933, filed on Sep. 5, 2014 in the Korean Intellectual Property Office (KIPO), the contents of which are hereby incorporated by reference in their entirety.

BACKGROUND

1. Field

Representative embodiments are directed to the fabricating of lithography masks. More particularly, representative embodiments are directed to a method of determining variations between positions of cell contacts of a semiconductor device, produced using a lithography mask, and their target (design) positions.

2. Description of the Related Art

Generally, a plurality of cell contacts may be formed in a cell block of a semiconductor device by exposing a resist formed over the area of the cell block using a lithography mask, developing the resist, and then etching an underlying layer using the developed resist as an etch mask, for example. In order to determine whether the cell contacts have been formed at the designed for target positions, degrees of alignment/misalignment between a target and the cell contacts may be quantified as shift values of the cell contacts. The lithography mask may then be corrected in accordance with the shift values.

Therefore, the shift values must be accurately determined if the lithography mask is to be properly corrected such that it can then be used to produce cell contacts located at desired relative positions.

SUMMARY

Representative embodiments include a method of calculating a shift value of a cell contact comprising demarcating a reference region from a correction region in an image of an actual cell block of a substrate where a plurality of actual cell contacts have been formed using a mask, measuring preliminary shift values of the actual cell contacts, respectively, whose images appear in the reference region of the image of the actual cell block, reducing the preliminary shift values of the actual cell contacts whose images appear in the reference region of the image of the actual cell block, and calculating actual shift values of the actual cell contacts in the correction region for a case in which the images of the cell contacts in the reference region are offset, by the reduced preliminary shift values, from corresponding target cell contacts of the target cell block. Each of the preliminary shift values represents an offset between a respective one of the actual cell contacts and a corresponding target cell contact of a target cell block.

Representative embodiments also include a method of calculating a shift value of a cell contact comprising measuring an eccentricity between each of actual cell contacts and each of target cell contacts from images of actual cell blocks to obtain preliminary shift values of the actual cell contacts, each of the actual cell blocks including a plurality of the actual cell contacts formed using a mask, and the target cell contacts corresponding to the plurality of actual cell contacts, removing noise from the preliminary shift values, reducing the preliminary shift values of the actual cell contacts whose images appear in reference regions of the images of the actual cell blocks, each of the reference regions corresponding to a central region of a respective one of the actual cell blocks, calculating sets of actual shift values of the actual cell contacts whose images appear in correction regions of the images of the actual cell blocks, each of the reference regions corresponding to peripheral region of a respective one of the actual cell blocks, and averaging the sets of actual shift values with one another. Each set of actual shift values is calculated for a case in which the images of the cell contacts in the reference region are offset by the reduced preliminary shift values from the corresponding target cell contacts of the target cell block.

A representative embodiment also provides a method of making a lithography mask, the method comprising forming an array of contact openings in each of at least one cell block of a substrate, including by performing a lithography process using a lithography mask, imaging the substrate to produce an actual image representative of at least one of the cell blocks, superimposing data representative of the actual image representative of the cell block with data representative of a target image including target cells corresponding to the contact openings whose images appear in the actual image representative of the cell block, and using the superimposed data to derive preliminary shift values of the contact openings whose images appear in a reference region of the actual image representative of the cell block, discounting the preliminary shift values of the contact openings whose images appear in the reference region, using the discounting preliminary shift values to calculate actual shift values of the contact openings whose images appear in a correction region of the actual image representative of the cell block, and performing lithography mask fabrication based on the actual shift values of the contact openings whose images appear in the correction region. The reference region corresponds to a central region of the cell block, and the preliminary shift values each correspond to a measure of offset between a respective one of images of the contact openings in the reference region and a corresponding target cell of the target image. The correction region corresponds to a peripheral region of the cell block.

BRIEF DESCRIPTION OF THE DRAWINGS

Representative embodiments will be more clearly understood from the following detailed description taken in conjunction with the accompanying drawings.

FIG. 1 is a flow chart of a representative embodiment of a method of calculating a shift value of cell contacts;

FIG. 2 is a schematic plan view of a process of superimposing images of an actual cell block and a target cell block in method of FIG. 1;

FIG. 3 is a conceptual diagram of a process used for measuring eccentricity between an actual cell contact and a target cell contact in the method of FIG. 1;

FIG. 4 is a schematic diagram of the image of the cell block showing vectors representing preliminary shift values of the actual cell contacts and obtained in the method of FIG. 1;

FIG. 5 is a schematic diagram of noise creating a linear shift in position of an image of an actual cell contact;

FIG. 6 is a schematic diagram of noise creating a linear and rotational shift in position of an image of an actual cell contact;

FIG. 7 is a schematic diagram of noise creating a reduction in an image of an actual cell contact;

FIG. 8 is a schematic diagram showing vectors representing actual shift values of the actual cell contacts obtained by minimizing preliminary shift values of the actual cell contacts in a reference region, in the method of FIG. 1;

FIG. 9 is a schematic diagram of a process of averaging the actual shift values of the actual cell contacts of a plurality of actual cell blocks in the method of FIG. 1;

FIG. 10 is a schematic diagram showing vectors of the average values of the actual shift values obtained in the process of FIG. 9, in the method of FIG. 1.

DETAILED DESCRIPTION OF THE PREFERRED EMBODIMENTS

Figure 1:
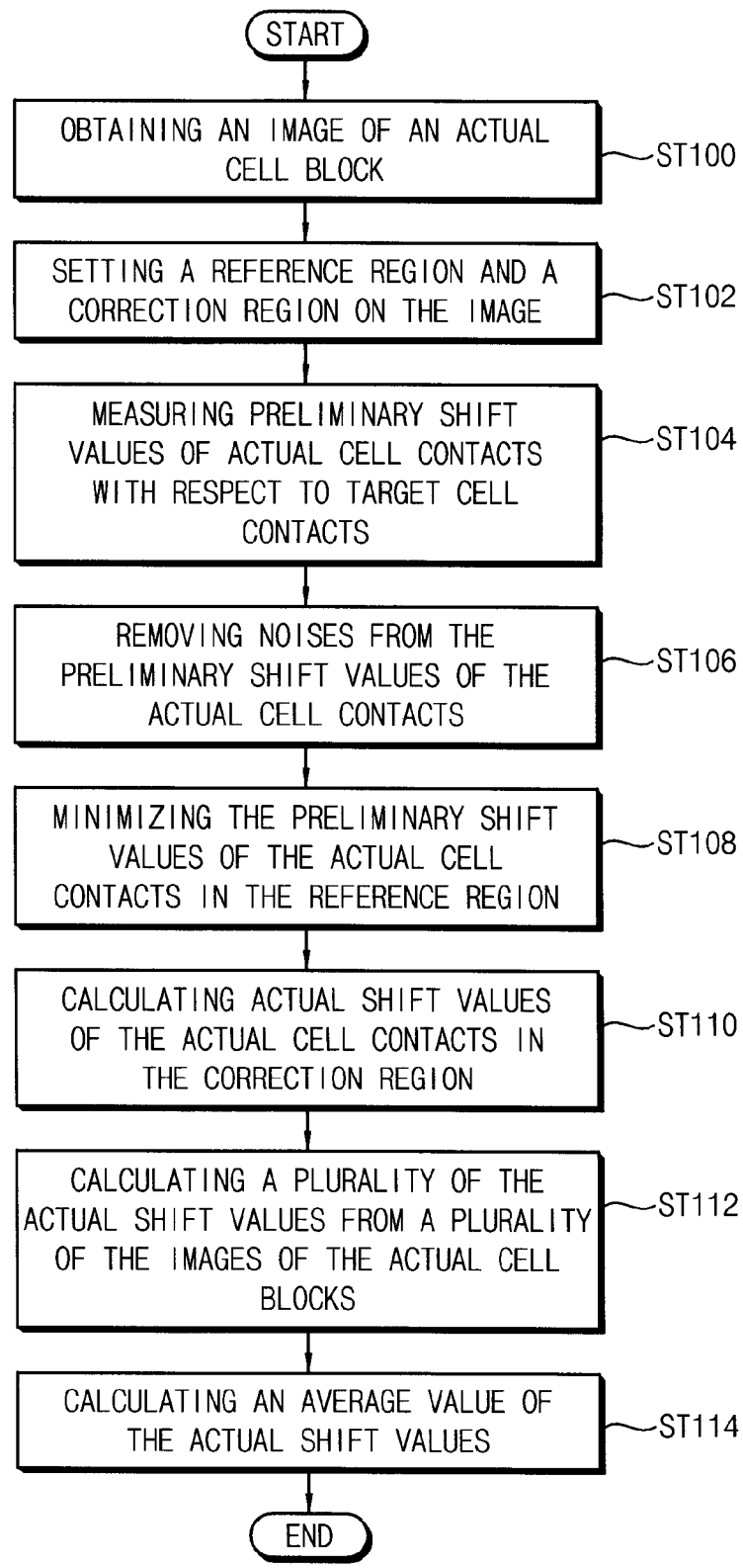
FIGS. 1 to 10 represent non-limiting, representative embodiments as described in more detail hereinafter.

Various representative embodiments will be described more fully hereinafter with reference to the accompanying drawings, in which some representative embodiments are shown. The present invention may, however, be embodied in many different forms and should not be construed as limited to the representative embodiments set forth herein. Rather, these representative embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," "left," "right," "upwardly," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular representative embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that some steps may be described in terms of what is carried out in an electronic sense, i.e., via an algorithm, versus in a real sense.

Representative embodiments are described herein with reference to cross-sectional illustrations that are schematic illustrations of idealized representative embodiments (and intermediate structures). As such, variations from the shapes of the illustrations as a result, for example, of manufacturing techniques and/or tolerances, are to be expected. Thus, representative embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, representative embodiments will be described in detail with reference to the accompanying drawings.

Referring to FIG. 1, a plurality of actual cell blocks may be formed on a semiconductor substrate by a lithography process using a mask. Each of the actual cell blocks includes a plurality of actual cell contacts. The actual cell contacts may be spaced from one another by substantially equal intervals in the actual cell block, e.g., may be arrayed uniformly in rows and columns.

In step ST100, an image of one of the actual cell blocks is obtained using a scanning electron microscope (SEM). The image of the actual cell block may be that of only a quarter or quadrant of the actual cell block. For example, in representative embodiments, four regions of the actual cell block having substantially the same size maybe demarcated by perpendicular lines crossing a center point of the actual cell block as viewed in plan, and the image of the actual cell block obtained may be that of only the right upper hand one of the four regions. Thus, a left lower hand corner of the image of the actual cell block will correspond to the center point of the actual cell block. Alternatively, the image of the actual cell block may be that of the entire actual cell block. In yet another alternative, the image of the actual cell block may be that of half of the actual cell block again, as seen in plan.

Figure 2:
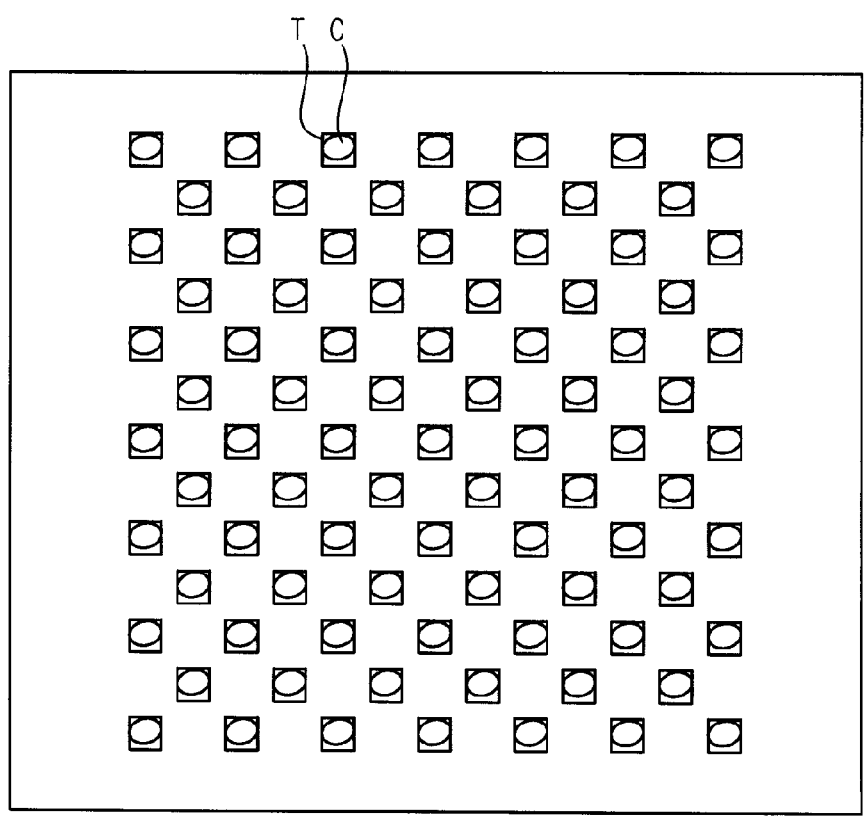

Referring to FIG. 2, an image of a target cell block is superimposed on the image of the actual cell block. The target cell block includes target cell contacts T having a designed shape and pattern corresponding to those of openings in a lithography mask. When the actual cell contacts C are accurately aligned with the target cell contacts T, respectively, it can be deemed that the actual cell contacts C would be formed at desired locations in a method comprising a lithography process using the mask. In this case, it might not be required to correct the mask. However, in the case shown in FIG. 2, the images of the actual cell contacts C are shifted (in the upward direction in the figure) with respect to the target cell contacts T. Therefore, in this case, it may be required to correct the mask.

Figure 4:
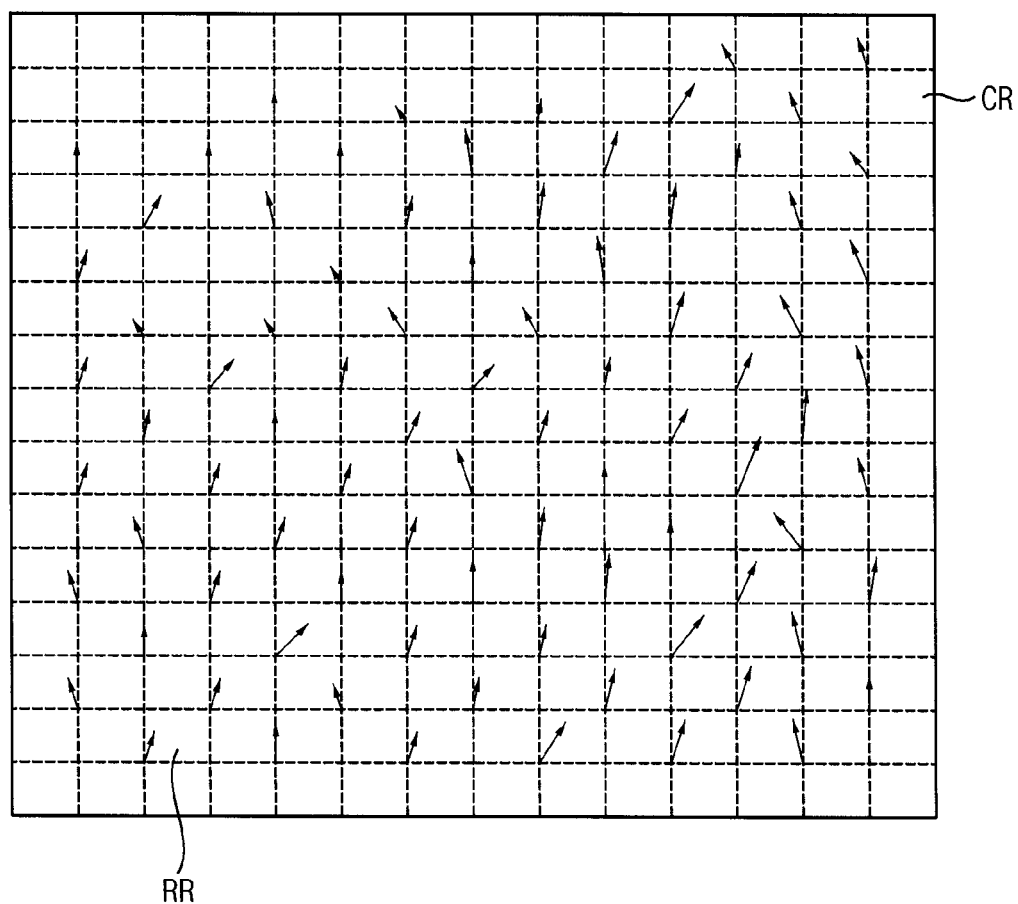

In step ST102, a reference region RR and a correction region CR may be set on the image of the actual cell block (See FIG. 4). The reference region RR includes a central region of the actual cell block. Thus, the reference region RR may include a point corresponding to the center point of the actual cell block. The correction region CR corresponds to an edge (peripheral) region of the actual cell block extending alongside the reference region RR (to the right and above the reference region RR in the figure).

In step ST104, a preliminary shift value of each of the actual cell contacts C. The preliminary shift value may be expressed as a vector of the eccentricity between the images of the actual cell contact C and corresponding target cell contact T. In this respect, the image of the actual cell block obtained using the SEM may correspond to an image in which the reference region RR is aligned with the image of the target cell block. However, in this case, the image of the actual cell block may have some distortion produced due to inherent characteristics of the SEM process. As a result, the measured preliminary shift values of the actual cell contacts whose images appear in the correction region CR may not correspond to the actual shift values of the actual cell contacts C whose images appear in the correction region CR (i.e., may not accurately reflect the actual amounts of offset between the images of the actual contacts in the correction region and the corresponding target cell contacts).

Figure 3:
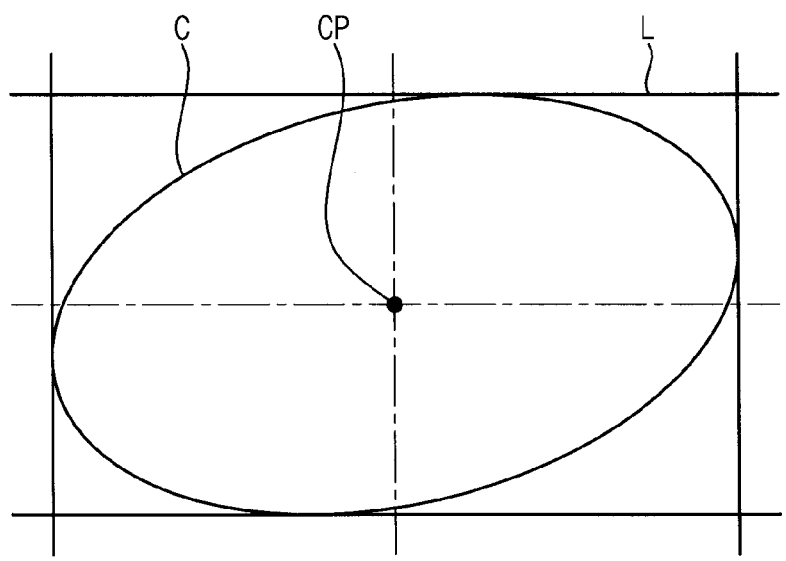

FIG. 3 shows a contour of an actual cell contact C in the image of the actual cell block that can be obtained by processing the image of the actual cell block. Reference character L designates a quadrilateral circumscribing the contour of the actual cell contact C. Reference character CP is the center of the quadrilateral L. The center CP of the quadrilateral L corresponds to the center of the actual cell contact C. Therefore, the quadrilateral L may be created and used to determine a coordinate of the center of the actual cell contact. The distance and direction between the center CP of the quadrilateral L and the center of the corresponding target cell contact T may be measured. This measurement of the offset between the center CP of the quadrilateral L and the center of the target cell contact T may correspond to the preliminary shift value of the actual cell contact C whose center coincides with center CP.

FIG. 4 shows the preliminary shift values of the actual cell contacts C. In FIG. 4, each of the arrows extends from an actual cell contact C and is a vector representative of the preliminary shift value of the actual cell contact C. In the example mentioned above, the images of the actual cell contacts C are shifted in an upward direction in the figures with respect to the target cell contacts T. Therefore, FIG. 4 shows this case with the arrows pointing upwardly.

In step ST106, noise is removed from the preliminary shift values of the actual cell contacts C. The noise may be removed to filter out a factor that affects the accuracy of the preliminary shift value as concerns a particular actual cell contact C, to filter out a factor that affects the actual cell block as a whole, or to filter out a factor that results in an enlargement or reduction in the image of the actual cell block, etc. However, the type of noise that is removed from the preliminary shift values may be determined experientially and/or statistically, etc., and therefore, the present embodiment is not limited to the removal of any particular form of noise from the preliminary shift values. In any case, the noise may be removed from the preliminary shift values of the actual cell contacts in the reference region RR and the correction region CR.

Figure 5:
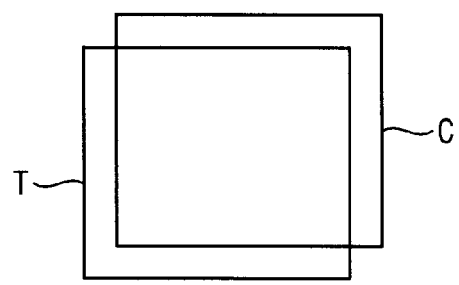
Figure 6:
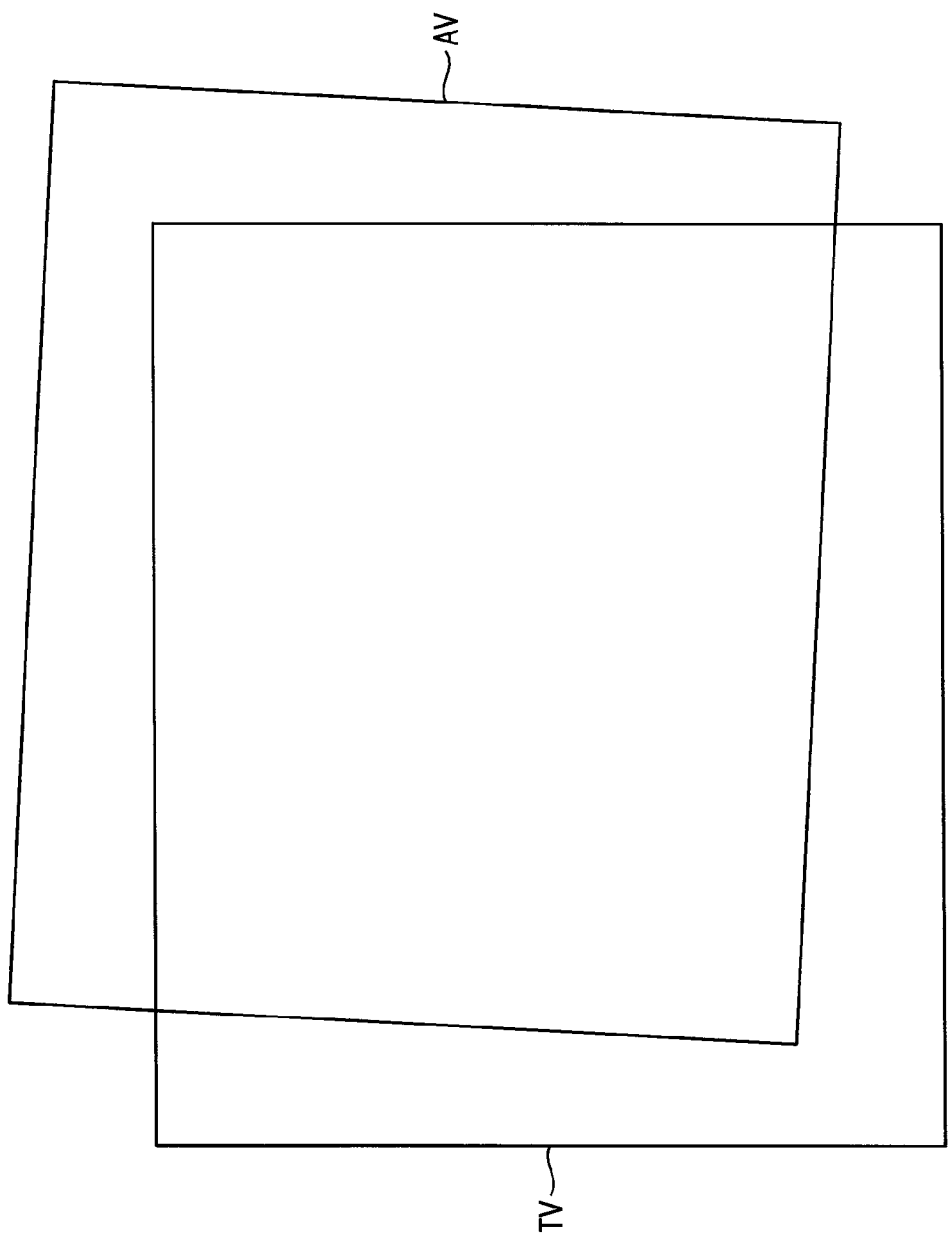
Figure 7:
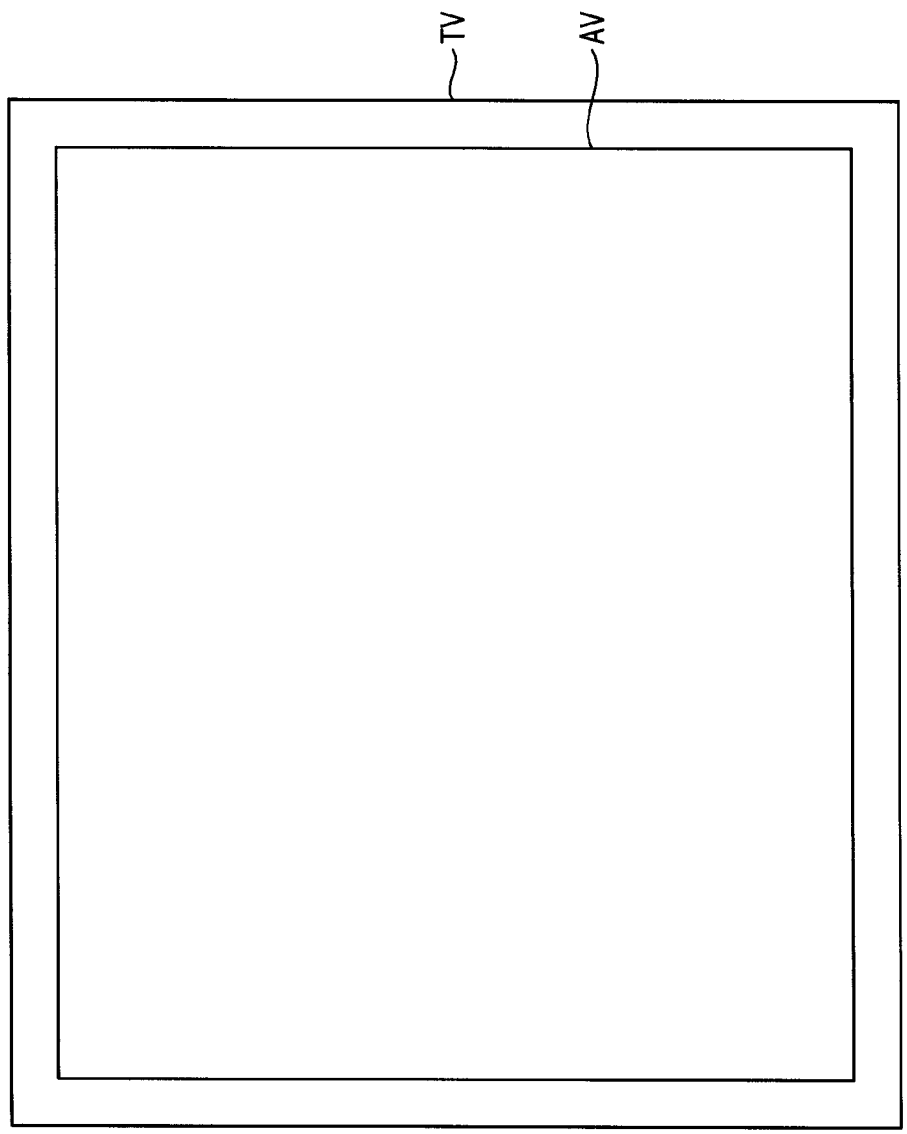

FIGS. 5-7 show examples of the affects of noise, and steps of removing the noise will be outlined below with reference to these figures.

FIG. 5 shows a case in which noise causes an actual cell contact C to be shifted upwardly and to the right with respect to the corresponding target cell contact T. The centers of the actual cell contact C and the target cell contact T are determinate in a coordinate system in which an X-axis extends to the left and right and a Y-axis extends up and down in the figure. In this case, the center of the actual cell contact C must therefore be moved in the X-axis and Y-axis directions if the center of the actual cell contact C is to coincide with the center of the target cell contact T.

FIG. 6 shows an image AV of the actual cell block shifted in the X-axis and Y-axis directions with respect to an image TV of the target cell block. Furthermore, in this case, the image AV of the actual cell block is rotated, about its center, with respect to the image TV of the target cell block. In this case, the image AV of the actual cell block must be moved in the X-axis and the Y-axis directions if the center of the image AV of the actual cell block is to coincide with the center of the image TV of the target cell block. In addition, the image AV of the actual cell block must be rotated if the sides of the image AV of the actual cell block are to align (coincide, for example) with sides of the image TV of the target cell block.

FIG. 7 shows an example of such a state in which the center of the image AV of the actual cell block coincides with the center of the image TV of the target cell block, and the sides of the image AV of the actual cell block are aligned with sides of the image TV of the target cell block. In this example, the image AV of the actual cell block is reduced compared to the image TV of the target cell block. Therefore, the image AV of the actual cell block must be enlarged if the image AV of the actual cell block is to coincide with the image TV of the target cell block. In another example, the image AV of the actual cell block may be enlarged compared to the image TV of the target cell block. In this case, the image AV of the actual cell block must be reduced if the image AV of the actual cell block is to coincide with the image TV of the target cell block.

Figure 8:
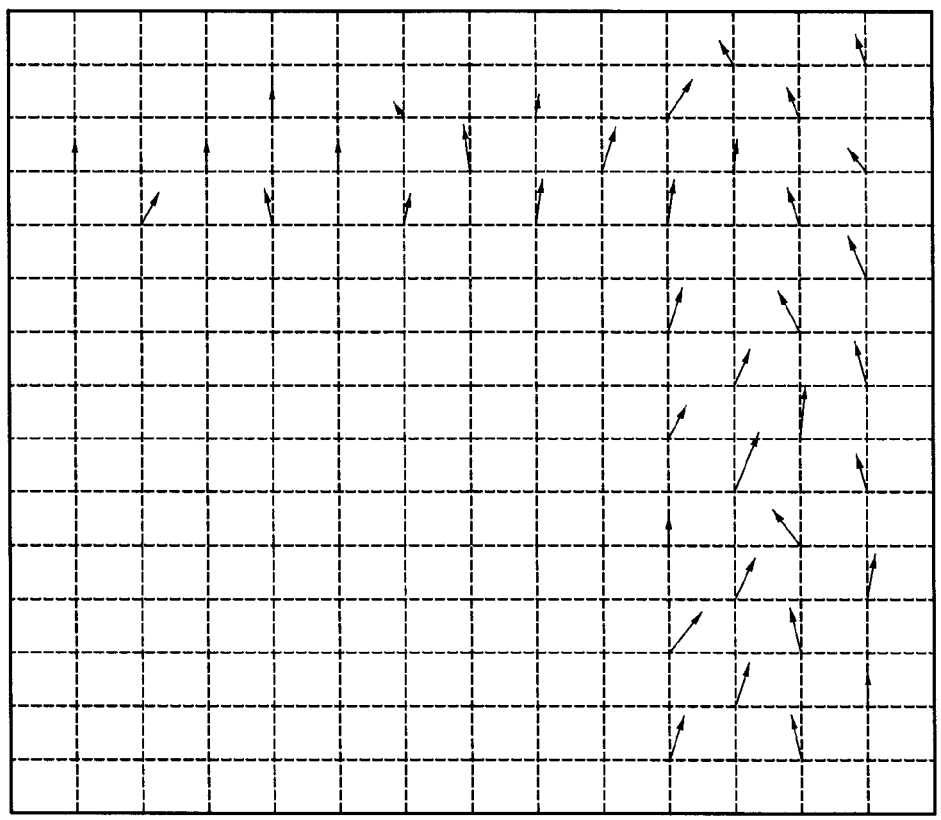

In step ST108, the preliminary shift values of the actual cell contacts C in the reference region RR are minimized. For example, the preliminary shift values of the actual cell contacts C in the reference region RR are weighted such that these preliminary shift values are reduced to about 0. Thus, as shown in FIG. 8, there are no arrows representing preliminary shift values of the actual cell contacts C in the reference region RR.

The lithography process should be performed using the mask under a condition in which an overlay between the mask and the portion of the substrate corresponding to the reference region RR is about 0. Thus, the preliminary shift values of the actual cell contacts C whose images appear in the reference region RR may be weighted such that they approach about 0.

In step ST110, actual shift values of the actual cell contacts C whose images appear in the correction region CR are calculated for the case, i.e., in a simulation of a state, in which the image of the actual cell block is one in which the images of the actual cell contacts in the reference region are offset from the respective target contacts of the image of the target cell block by the minimized preliminary shift values. That is, the actual shift values of the actual cell contacts C whose images appear in the correction region CR are calculated for the case of the minimized preliminary shift values of the actual cell contacts C whose images appear in the reference region RR. Lengths and directions of the arrows extending from the actual cell contacts C in the correction region CR in FIG. 8 represent the magnitudes and directions of the actual shift values of the actual cell contacts C whose images appear in the correction region CR.

The lithography mask may be corrected based on the actual shift values (described below in more detail with reference to FIG. 11). Thus, the corrected mask reflects the actual shift values of the actual cell contacts C whose images appeared in the correction region CR. Therefore, cell contacts may be accurately formed (at relatively precise desired relative positions) using the corrected mask.

Figure 9:
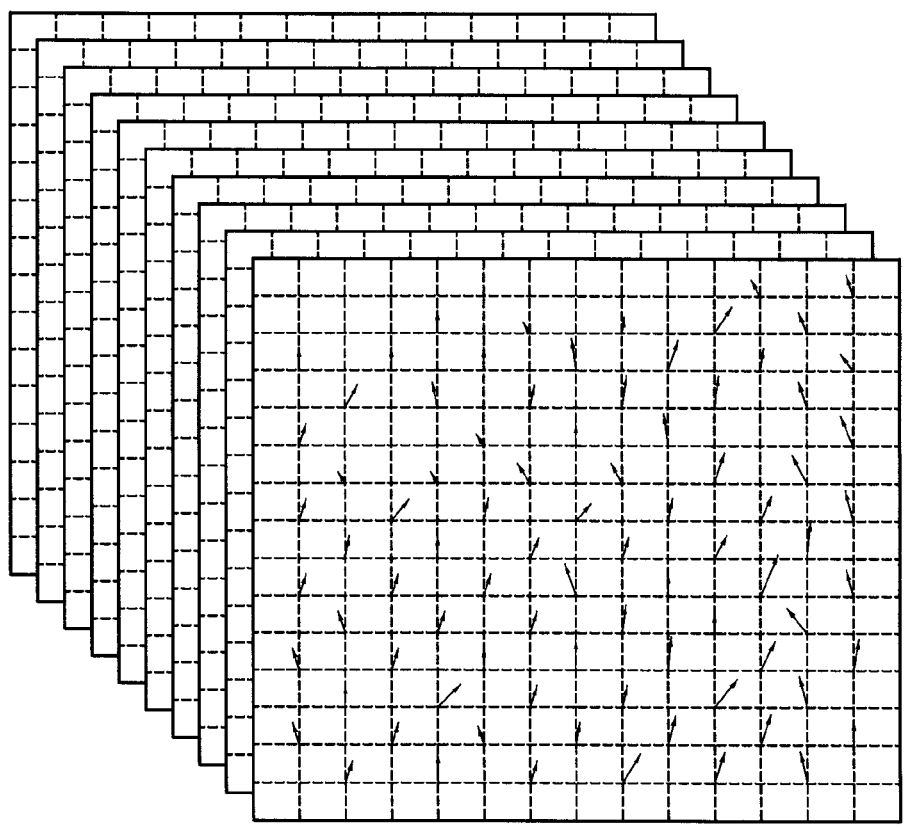

Additionally, in step ST112, as shown in FIG. 9, the above-mentioned processes may be performed for each of one or more additional ones of the actual cell blocks so that at least one additional set of actual shift values for the cell contacts of another of the actual cell blocks is obtained. As is clear from the description earlier, the actual cell contacts in each of the actual cell blocks have substantially the same form and arrangement as the actual cell contacts in each of the other actual cell blocks.

Figure 10:
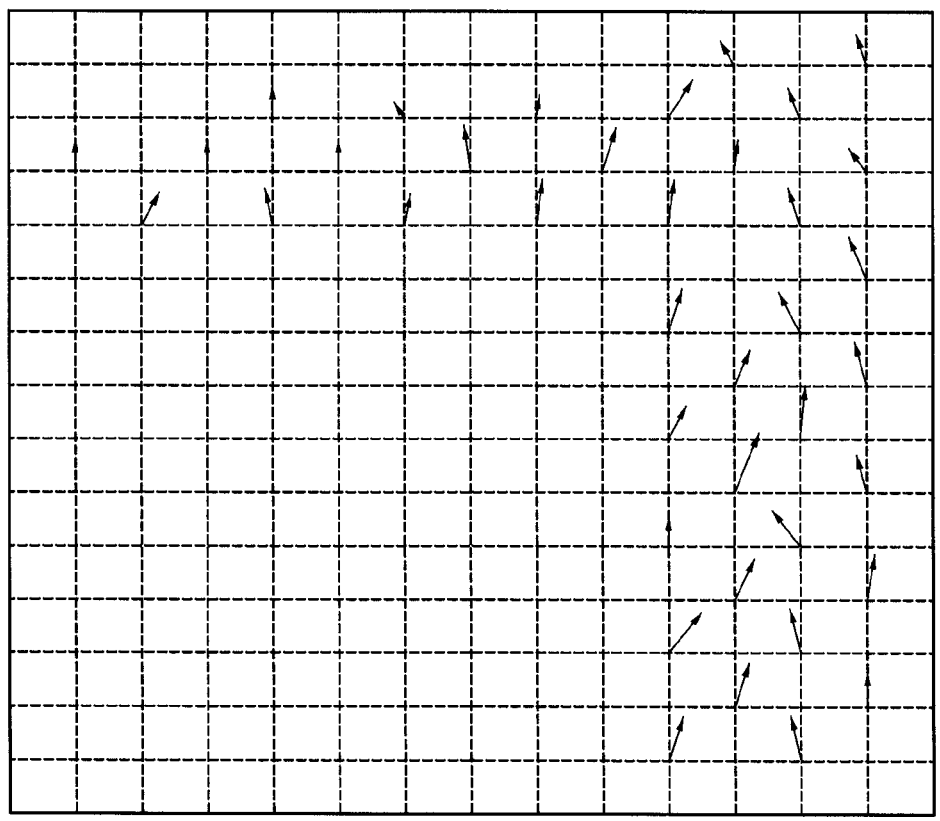

In step ST114, as shown in FIG. 10, the sets of actual shift values derived for the actual cell blocks are averaged. The resulting set of average values may more accurately represent the shifts of the actual cell contacts C whose images appear in the correction region CR from their target (design) positions.

Figure 11:
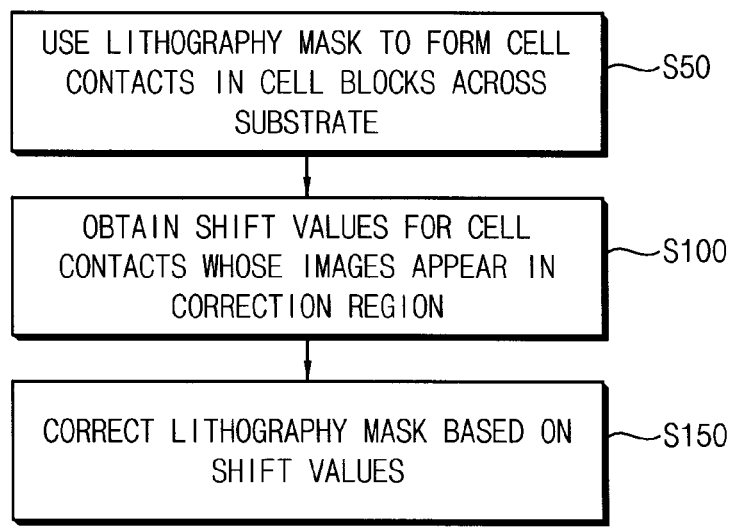
FIG. 11 is a flowchart of a representative embodiment of a method of fabricating a lithography mask according to the inventive concept.

FIG. 11 shows the basic flow of a method of fabricating a lithography mask according to the inventive concept.

First, as described earlier before the description of ST00 in FIG. 1, cell contacts are formed each across at least one cell block of a substrate in a method that includes a lithography process using a mask as a lithograph mask (S50). Then actual shift values of respective ones of the cell contacts are calculated according to an embodiment as described with reference to FIGS. 1-10 (S100). Then, a lithography mask fabrication based on the actual shift values is performed (S15). This lithography mask fabrication may be a process of correcting the lithography mask used in producing the cell contacts. Various techniques for correcting an optical mask are known, per se, and depend in general on the type of mask and so, will not be described here in detail.

According to representative embodiments as described above, the actual shift values of the cell contacts in the peripheral region of the cell block may be accurately calculated by minimizing the preliminary shift values of the cell contacts in a central region of the cell block. A lithography mask may be precisely corrected/fabricated using the shift values so that cell contacts may be formed relatively precisely at designed for positions using the mask.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of making a lithography mask, the method comprising:
    forming an array of contact openings in each of at least one cell block of a substrate by performing a lithography process using a lithography mask;
    imaging the substrate to produce an actual image of at least one of the cell blocks;
    superimposing data representative of the actual image of the cell block with data representative of a target image including target cells corresponding to the contact openings whose images appear in the actual image of the cell block to thereby obtain superimposed data, and
    using the superimposed data to derive preliminary shift values of the contact openings whose images appear in a reference region of the actual image of the cell block, wherein the reference region corresponds to a central region of the cell block, and the preliminary shift values each correspond to a measure of offset between a respective one of images of the contact openings in the reference region and a corresponding target cell of the target image;
    discounting the preliminary shift values of the contact openings whose images appear in the reference region;
    using the discounted preliminary shift values to calculate actual shift values of the contact openings whose images appear in a correction region of the actual image of the cell block, wherein the correction region corresponds to a peripheral region of the cell block; and
    performing lithography mask fabrication based on the actual shift values of the contact openings whose images appear in the correction region.

2. The method of claim 1, wherein the actual image is produced using scanning electron microscopy.

3. The method of claim 1, wherein discounting the preliminary shift values of the contact openings whose images appear in the reference region comprises weighting the preliminary shift values with values such that the preliminary shift values approach 0.

4. The method of claim 1, wherein a plurality of blocks of the contact openings are imaged to produce actual images of respective blocks of contact openings,
    sets of actual shift values are calculated in the manner claimed in claim 1 for the contact openings whose images appear in the correction regions of the actual images of the blocks of contact openings, respectively,
    the set of actual shift values are averaged with one another to produce a set of average shift values, and
    the lithography mask fabrication is based on the set of average shift values.

5. The method of claim 1, wherein the lithography mask fabrication comprises correcting the lithography mask used to produce the contact openings.

* * * * *

UNITED STATES PATENT AND TRADEMARK OFFICE
CERTIFICATE OF CORRECTION

PATENT NO. : 9,703,189 B2  
APPLICATION NO. : 14/685620  
DATED : July 11, 2017  
INVENTOR(S) : Ki-Ho Yang, Sibo Cai and Seung-Hune Yang It is certified that error appears in the above-identified patent and that said Letters Patent is hereby corrected as shown below:

On the Title Page

Column 1, item (54) and in the Specification, Column 1, Line 1 in the Title:
Delete "VALE" and insert -- VALUE --

Signed and Sealed this  
Ninth Day of April, 2024

Katherine Kelly Vidal  
*Director of the United States Patent and Trademark Office*